United States Patent [19]

Richmond et al.

[11] Patent Number: 4,525,675
[45] Date of Patent: Jun. 25, 1985

[54] ULTRA LINEAR FREQUENCY DISCRIMINATOR CIRCUITRY

[75] Inventors: Carl T. Richmond; Thomas A. Butler, both of Scottsdale, Ariz.; Joseph E. Andrews, Jr., San Jose, Calif.

[73] Assignee: Motorola, Inc., Scahumburg, Ill.

[21] Appl. No.: 483,036

[22] Filed: Apr. 7, 1983

[51] Int. Cl.³ ............... H03K 5/00; H03K 11/00; H03K 9/06
[52] U.S. Cl. ................... 328/140; 328/136; 307/519; 307/520; 307/522; 307/540; 307/552; 307/553; 307/261; 333/126; 333/129; 333/132; 333/134; 329/110; 329/168; 329/170
[58] Field of Search ............... 328/140, 136; 307/519, 307/261, 510, 522, 520, 540, 552, 553, 546; 333/117, 100, 132, 123, 126, 129, 134; 329/110, 168, 170

[56] References Cited

U.S. PATENT DOCUMENTS

| | | | |
|---|---|---|---|
| 3,324,400 | 6/1967 | Battail et al. | 329/110 |
| 3,614,640 | 10/1971 | Wolf | 329/110 |
| 3,758,868 | 9/1973 | Brown | 328/165 |
| 3,909,717 | 9/1975 | Gazzano | 324/166 |
| 3,921,083 | 11/1975 | Kratt et al. | 329/110 |
| 4,079,325 | 3/1978 | Mawhinney et al. | 328/140 |
| 4,085,377 | 4/1978 | Turski et al. | 329/116 |
| 4,163,951 | 8/1979 | Alhara et al. | 331/1 A |

Primary Examiner—Stanley D. Miller
Assistant Examiner—Richard Roseen
Attorney, Agent, or Firm—Eugene A. Parsons

[57] ABSTRACT

Signals to be discriminated are supplied through a controllable attenuator and power splitter to first and second discriminators with response slopes which are equal and of opposite sign. The outputs of the discriminators are summed and a reference signal is subtracted from the sum to produce a control signal which adjusts the input attenuator to maintain the amplitude of the input signal constant. The outputs of the discriminators are also subtracted to provide an output signal which is a linear function of frequency and independent of input amplitude.

10 Claims, 2 Drawing Figures

ULTRA LINEAR FREQUENCY DISCRIMINATOR CIRCUITRY

BACKGROUND OF THE INVENTION

The present invention pertains to frequency discriminator circuitry which provides an output signal that is a linear function of the frequency of an input signal and which is independent of amplitude fluctuations of the input signal. Because frequency discriminators generally have a limited range over which they are linear, variations in the amplitude of input signals can produce nonlinear responses therein. To eliminate this problem prior art discriminators generally require the use of a limiter in the path of the input signal. This solution is unsatisfactory, particularly at microwave frequencies. AGC loops and limiters prior to the discriminator circuitry do not allow for variations between the AGC loop or limiter and the discriminator or for variations in the discriminator itself.

SUMMARY OF THE INVENTION

The present invention pertains to frequency discriminator circuitry wherein an input signal is supplied through a controllable attenuator to a power splitter, which splitter supplies substantially equal signals to a low pass filter/amplitude detector circuit and a high pass filter/amplitude detector circuit. The two output signals from the detectors are combined to produce a control signal which adjusts the attenuator so that the amplitude of the input signal to the power splitter is held constant and independent of input amplitude. The output signals of the detectors are also subtracted to produce an output signal which is a linear function of frequency and independent of the amplitude of the input signal.

It is an object of the present invention to provide new and improved ultra linear frequency discriminator circuitry.

It is a further object of the present invention to provide new and improved ultra linear frequency discriminator circuitry which controls the amplitude of the input signal applied thereto so that the output signal is a linear function of frequency of the input signal.

It is a further object of the present invention to provide new and improved ultra linear frequency discriminator circuitry which is easily implemented in microwave form.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
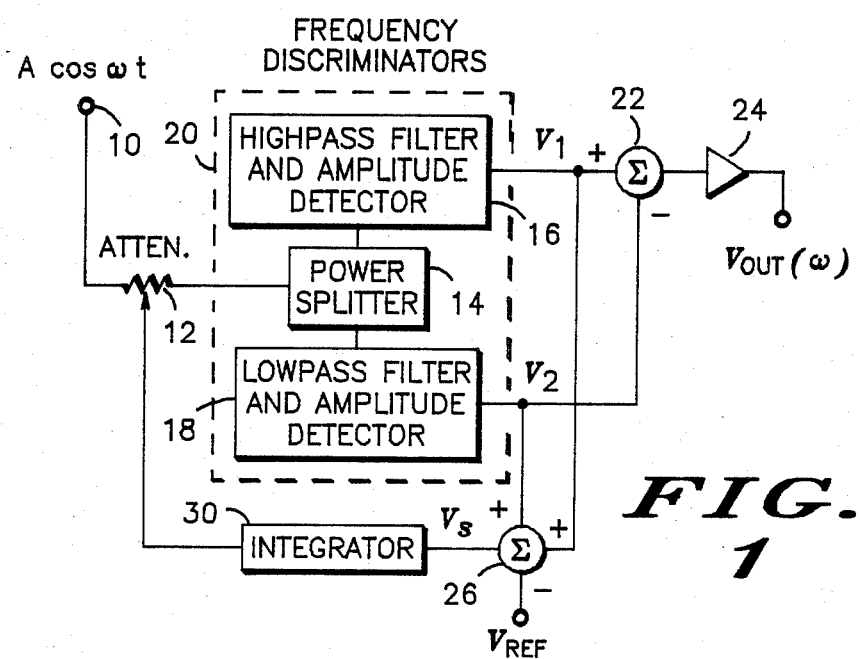
FIG. 1 is a block diagram of ultra linear frequency discriminator circuitry embodying the present invention.

Referring specifically to FIG. 1, an input terminal 10 is adapted to receive an input signal, designated A cos wt. The signal is applied through a controllable attenuator 12, which is illustrated schematically as a variable resistor. The attenuator 12 could be, for example, a pin diode attenuator utilized for microwave frequencies or any other adjustable type of attenuator, many varieties of which are well known on the market. The output of the attenuator 12 is applied to a power splitter 14, which supplies signals of substantially equal power to first and second discriminator circuits 16 and 18, respectively. The power splitter 14 and discriminators 16 and 18 are provided, in this preferred embodiment, as a single hybrid circuit on a substrate designated 20. By supplying the power splitter 14 and discriminators 16 and 18 on the single substrate 20, the discriminators can be matched to further reduce discrepancies due to amplitude changes. Discriminator 16 includes a high pass filter and an amplitude detector while discriminator 18 includes a low pass filter and an amplitude detector so that the response slopes of the discriminators 16 and 18 are equal and of opposite sign. The signal produced by discriminator 16 is defined by the equation $$V_1 = m(\omega - \omega_o) + b_1 \tag{1}$$

where
 $m$ = filter sensitivity
 $\omega_o$ = center frequency of interest
 $b$ = offset amplitude
 $\omega$ = input frequency The signal provided by discriminator 18 is defined by $$V_2 = -m(\omega - \omega_o) + b_2 \tag{2}$$

The output signals from the discriminators 16 and 18 are supplied to a summation circuit 22 such that the signal from the discriminator 18 is subtracted from the signal from the discriminator 16. The output of the summation circuit 22 is amplified in an amplifier 24 and the output signal is defined by the equation $$V_{out} = 2m(\omega - \omega_o) + b_1 - b_2 \tag{3}$$

Since both $b_1$ and $b_2$ are independent of frequency, the output signal, $V_{out}$, is a linear function of the frequency of the signal applied to terminal 10.

The two output signals from the discriminators 16 and 18 are also supplied to a summation circuit 26. A reference voltage, $V_{ref}$, is supplied to the summation circuit 26 so as to be subtracted from the sum of the two output signals from the discriminators 16 and 18. The output signal $V_s$ from the summation circuit 26 is defined by the equation $$V_s = b_1 + b_2 - V_{ref} \tag{4}$$

The signal $V_s$ is supplied through an integrator 30 to the control input of the attenuator 12. The action of the attenuator loop is to force $b_1 + b_2$ to equal $V_{ref}$, a constant. Thus the amplitude at the input to the power splitter 14 is held constant and $V_{out}$ becomes independent of input amplitude (A).

Figure 2:
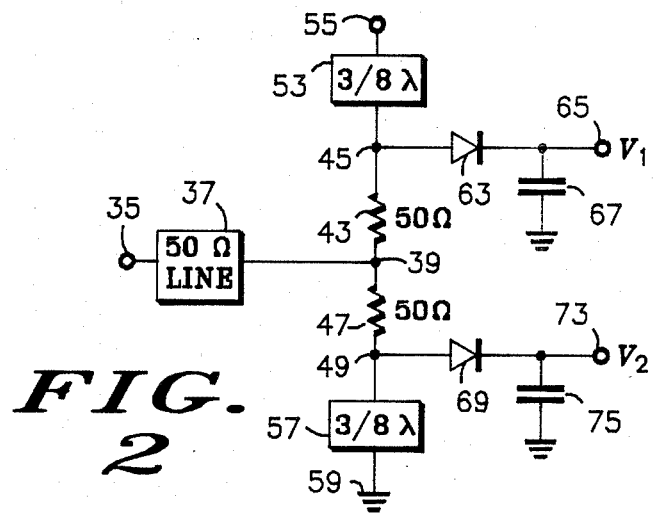
FIG. 2 is a schematic diagram of portions of the apparatus illustrated in block form in FIG. 1.

Referring specifically to FIG. 2, a schematic diagram is illustrated of a power splitter and frequency discriminators which might be utilized in a microwave version of the apparatus illustrated in FIG. 1. An input terminal 35 is adapted to receive the output signal from the controllable attenuator and supply the signal through a 50 ohm transmission line 37 to a junction 39. One end of a 50 ohm resistor 43 is connected to the junction 39 and the other end is connected to a junction 45. One end of a 50 ohm resistor 47 is connected to the junction 39 and the other end is connected to a junction 49. An open stub transmission line 53, which is less than one-half wavelength and preferably approximately ⅜ wavelength, is connected between the junction 45 and a terminal 55 adapted to have a source of power applied thereto. A shorted stub transmission line 57, which is less than ½ wavelength long and preferably approximately ⅜ wavelength long, is connected between the junction 49 and a reference potential, such as ground 59. The anode of a semiconductor diode 63 is connected to the junction 45 and the cathode is connected to an output terminal 65 as well as through a capacitor 67 to ground. The anode of a semiconductor diode 69 is connected to the junction 49 and the cathode is connected to an output terminal 73 as well as through a capacitor 75 to ground. Thus, the 50 ohm line 37 and the 50 ohm resistors 43 and 47 operate as a power splitter to divide the input signal between the two discriminators. The open stub transmission line 53 operates as a high pass filter and the shorted stub transmission line 57 operates as a low pass filter with the diodes 63 and 69 providing the amplitude detection. It will be understood by those skilled in the art that this particular embodiment is especially adapted for microwave frequencies and can easily be constructed on a single substrate to provide matched discriminators.

Thus, ultra linear frequency discriminator circuitry is illustrated wherein matched frequency discriminators are utilized in a closed attenuator loop to eliminate input amplitude variations. The two discriminators provide near linear response over the band of interest with slopes of opposite sign. Because the discriminators are included in the attenuator loop a more exact control of signal amplitude is obtained. Further, the specific microwave circuitry illustrated provides reduced susceptibility to amplitude variations at microwave frequencies where interface discontinuities cause amplitude to vary with frequency.

While we have shown and described a specific embodiment of this invention, further modifications and improvements will occur to those skilled in the art. We desire it to be understood, therefore, that this invention is not limited to the particular form shown and we intend in the appended claims to cover all modification which do not depart from the spirit and scope of this invention.

We claim:

1. Ultra linear frequency discriminator circuitry comprising:
    controllable attenuation means having a signal input, with varying frequency and amplitude a control input and an output, for providing different amounts of attenuation to signals applied to the signal input thereof in response to control signals applied to the control input thereof;
    first and second discriminator circuits each having a linear response over a predetermined band of frequencies and with response slopes which are equal and of opposite sign;
    a power splitter coupling each of said first and second discriminator circuits to the output of said controllable attenuation means;
    signal combining means connected to receive output signals from said first and second discriminator circuits for combining the output signals to provide a discriminator circuitry output signal which is a linear function of the frequency of signals applied to the signal input of said controllable attenuation means; and
    control signal generating means connected to receive the output signals from said first and second discriminator circuits and having an output connected to the control input of said controllable attenuation means for generating a control signal that maintains amplitudes of signals supplied to said power splitter from said controllable attenuation means constant whereby the discriminator circuitry output signal from said signal combining means is independent of the amplitude of signals applied to the signal input of said controllable attenuation means.

2. Ultra linear frequency discriminator circuitry as claimed in claim 1 wherein the control signal generating means includes:
    signal combining means connected to receive the output signals from said first and second discriminator circuits for summing the output signals to provide a control signal, and
    means for connecting the control signal of said signal combining means to the control input of said controllable attenuation means.

3. Ultra linear frequency discriminator circuitry as claimed in claim 2 wherein the signal combining means includes an input for a reference voltage source, the reference voltage being equal and opposite in polarity to the sum of the output signals from said first and second discriminator circuits.

4. Ultra linear frequency discriminator circuitry as claimed in claim 2 wherein the means for connecting the control signals includes an integrator.

5. Ultra linear frequency discriminator circuitry as claimed in claim 1 wherein the first discriminator circuit includes a high pass filter and an amplitude detector.

6. Ultra linear frequency discriminator circuitry as claimed in claim 5 wherein the second discriminator circuit includes a low pass filter and an amplitude detector.

7. Ultra linear frequency discriminator circuitry as claimed in claim 6 wherein the low pass and high pass filters include an equal number of poles.

8. Ultra linear frequency discriminator circuitry as claimed in claim 6 wherein the high pass filter includes an open transmission line stub effectively shorter than one-half wavelength at a center frequency of interest and the low pass filter includes a shorted transmission line stub effectively shorter than one-half wavelength at the center frequency of interest.

9. Ultra linear frequency discriminator circuitry as claimed in claim 8 wherein the amplitude detectors each include a semiconductor diode.

10. A method of frequency discrimination substantially independent of the amplitude of input signals comprising the steps of:
    splitting an input signal into two signals equal in power;
    high pass filtering and amplitude detecting one of the two signals to produce an output signal defined by $$V_1 = m(\omega - \omega_o) + b_1$$

where
    m = filter sensitivity
    $\omega_o$ = center frequency of interest
    b = offset amplitude
    $\omega$ = input frequency
    low pass filtering and amplitude detecting the other of the two signals to produce an output signal defined by $$V_2 = -m(\omega - \omega_o) + b_2$$

subtracting the two output signals to obtain a frequency discriminated output signal defined by $$V_{out} = 2m(\omega - \omega_o) + b_1 - b_2$$

combining the two output signals with a reference voltage, $V_{ref}$, to produce a control signal defined by $$V_s = b_1 + b_2 - V_{ref}$$

controlling the amplitude of the input signal prior to splitting so that $V_s$ is zero.

* * * * *